Figure 1:
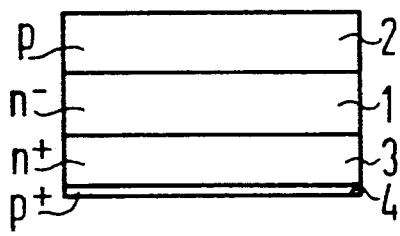
Figure 2:
Figure 3:
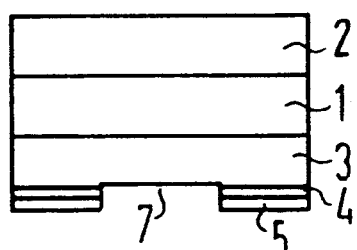

United States Patent [19]

Schuh et al.

[11] Patent Number: 5,079,175
[45] Date of Patent: Jan. 7, 1992

[54] PROCESS FOR THE MANUFACTURE OF SHORT CIRCUITS ON THE ANODE SIDE OF THYRISTORS

[75] Inventors: Gottfried Schuh, Augsburg; Hans-Joachim Schulze, Ottobrunn, both of Fed. Rep. of Germany

[73] Assignee: Eupec Europaeische Gesellsch. F. Liestungshalbleiter mbH + Co. KG, Warstein-Belecke, Fed. Rep. of Germany

[21] Appl. No.: 629,312

[22] Filed: Dec. 18, 1990

[30] Foreign Application Priority Data

Dec. 19, 1989 [DE] Fed. Rep. of Germany ....... 3941932

[51] Int. Cl.$^5$ ............................................. H01L 49/00
[52] U.S. Cl. ........................................ 437/6; 437/915; 357/37; 357/38; 357/39; 148/DIG. 140
[58] Field of Search ................. 437/6, 915; 357/37, 357/38, 39; 148/DIG. 140

[56] References Cited

U.S. PATENT DOCUMENTS

| | | | |
|---|---|---|---|
| 4,599,633 | 7/1986 | Thire et al. | 357/38 |
| 4,607,273 | 8/1986 | Sakurada et al. | 148/DIG. 140 |
| 4,613,381 | 9/1986 | Ogura | 437/6 |
| 4,662,957 | 5/1987 | Halino | 357/38 |
| 4,729,007 | 3/1988 | Coe | 357/38 |
| 4,742,382 | 5/1988 | Jaecklin | 357/39 |
| 4,918,509 | 4/1990 | Schlangenotto | 357/20 |
| 4,961,099 | 10/1990 | Roggwiller | 357/38 |

FOREIGN PATENT DOCUMENTS

| | | | |
|---|---|---|---|
| 55-39618 | 3/1980 | Japan | 437/6 |
| 58-171857 | 10/1983 | Japan | 437/6 |
| 1-223767 | 9/1989 | Japan | 437/6 |

Primary Examiner—Brian E. Hearn
Assistant Examiner—Kevin M. Picardat
Attorney, Agent, or Firm—Jeffrey P. Morris

[57] ABSTRACT

Short circuits on the anode side of thyristors can be manufactured easily and inexpensively if a p-doped layer is first generated on the anode side. On it, after an oxide masking and structuring process, grooves (7) are produced, which extend into the base zone (1) of the thyristor on the anode side, in which the short-circuit areas are then generated. After the oxide has been removed, the anode electrode is applied, which contacts the p-doped layer and the short-circuit areas. As an alternative, the short-circuit areas may also be generated first through the openings of a structured oxide. Then, after removal of the oxide, the entire surface is p-doped, with the doping being less than that of the short-circuit areas. Then the anode electrode is applied.

10 Claims, 1 Drawing Sheet

PROCESS FOR THE MANUFACTURE OF SHORT CIRCUITS ON THE ANODE SIDE OF THYRISTORS

BACKGROUND OF THE INVENTION

The invention concerns a process for the manufacture of short circuits on the anode side of thyristors which have an anode base zone of the first conducting type and an emitting zone on the anode side of the second conducting type.

Short circuits on the anode side are essential for GTO thyristors, because no short circuits are possible on the cathode side in this case. They are also advantageously employed, in addition to short circuits on the cathode side, in asymmetric thyristors—that is, those thyristors that only block in the discharge direction, since by this means the storage load on the anode side of the semiconductor body—and consequently the recovery time can be reduced.

The purpose of the invention is to describe a particularly simple process for the manufacture of this kind of short circuit on the anode side. In particular, this process requires only a single additional mask. This purpose is accomplished by the following steps:
a) a zone of the second conducting type is generated over the entire surface on the anode side in the semiconductor body of the first conducting type,
b) the entire surface of this zone is covered with a masking layer,
c) the masking layer is structured by photolithography,
d) grooves are etched in the semiconductor body according to its structure which extend through the zone of the second conducting type as far as the anode base zone,
e) in the grooves, zones of the first conducting type are generated, which have a higher doping concentration that the anode base zone,
f) the masking layer is removed,
g) the surface on the anode side of the semiconductor body is covered with a contact layer.

According to an alternative method, the purpose is accomplished by the following steps:
a) the anode side of the semiconductor body of the first conducting type is covered over its entire surface with a masking layer,
b) the masking layer is structured by photolithography,
c) in the semiconductor body, zones are generated according to its structure with higher doping than the anode base zone,
d) the structured masking layer is removed,
e) over the entire surface of the anode side of the semiconductor body, a doped layer of the second conducting type is generated, with a doping less than that of the zones of the first conducting type.
f) the surface of the anode side of the semiconductor body is covered with a contact layer.

Figure 7:
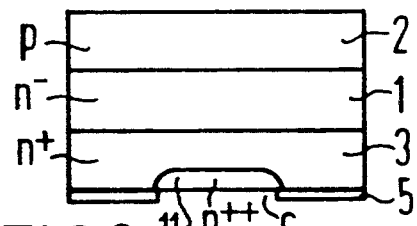
Figure 8:
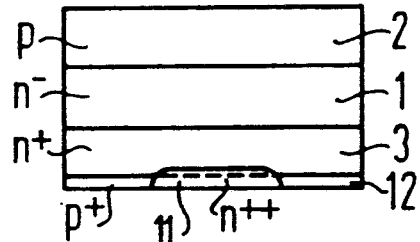
Figure 9:
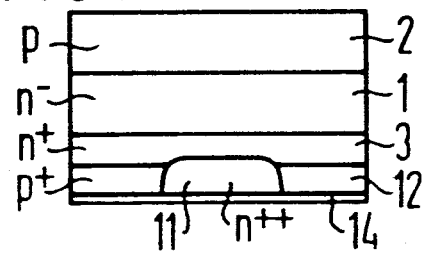

Refinements of the invention are covered in the subsidiary claims. The invention is described in greater detail with the aid of FIGS. 1-9. Specifically, FIGS. 1-6 show a first embodiment with the aid of characteristic process steps on the semiconductor body of a thyristor, and FIGS. 7-9 show a second embodiment, likewise with the aid of characteristic process steps on a thyristor.

The semiconductor body shown in FIG. 1 has a weak n-doped anode base zone 1. Adjacent to it on the cathode side is a p-doped cathode base zone 2, which has a higher net doping concentration than zone 1. Adjacent to zone 1 on the anode side is a strong n-doped zone 3, which acts as a so-called stop layer. It prevents a punch-through on the anode side when the thyristor is loaded in the discharge direction. The above mentioned zones are generated in a conventional manner. As the first process step in accordance with the invention, a strong p-doped zone 4 is generated on the anode side, for example by ion implantation with boron or aluminum. The next process step (FIG. 2) is to apply a masking layer 5 to the surface of the anode side of the semiconductor body, which can be accomplished, for example, by oxidation of the surface of the anode side of the semiconductor body or by applying CVD oxide.

Figure 4:
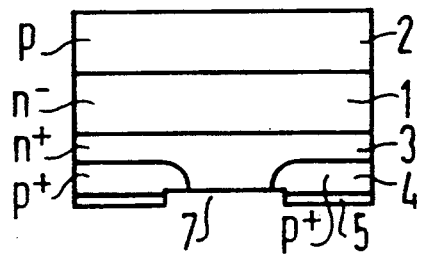
Figure 5:
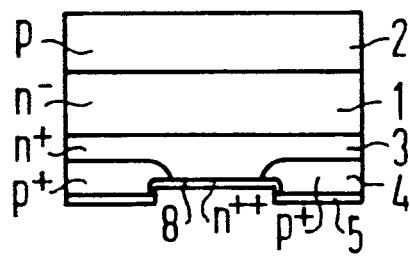
Figure 6:
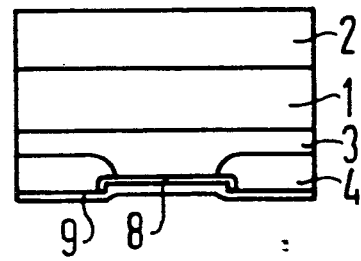

Next, an opening 6 is etched in the layer 5. After that a groove 7 is etched (FIG. 3) in the surface of the anode side of the semiconductor body, with the masking layer 5 serving as an etching mask. The etching is continued until the zone 4 is etched through and the surface of the stop layer is exposed. The etching process can be continued until a groove is created in the surface of the stop layer 3. If it is desired to give the zone 4 a greater depth, it can then be impressed into the stop layer 3 by tempering, as shown in FIG. 4. As the next step (FIG. 5), an n-doped zone 8 with very high doping is generated in the groove 7, for example, by ion implantation with a subsequent tempering step, or a phosphorus diffusion. In this case, the masking layer 5 again serves as a mask. As the last essential step (FIG. 6), the masking layer 5 is removed and a contact layer 9 is applied on the anode side. This serves as the anode electrode and might be made, for example of aluminum. It also forms the short circuit between zone 12, which acts as the anode emitter zone and the stop layer 3 belonging to the anode base zone 1.

As an alternative, after the masking layer has been removed, an alloy (for example, Al-Si) can be applied on the anode side for contacting an, in general to connect the thyristor to a carrier board (For example, Mo). If an alloy is applied, the concentration of zone 8 must be substantially higher than the p-doping produced, for example, by applying an Al alloy.

The other process stops required for an asymmetric thyristor or a GTO thyristor, such as manufacture of the cathode emitter zone, edge finishing etc. are not described here, as they are part of the state of the art.

The process described can also be used for asymmetric thyristors without a stop layer 3. However, a stop layer is almost present, since advantageous transmission characteristics can thereby be achieved, and a thyristor with short circuits on the anode side in the backward direction does not have to receive any significant blocking voltage.

The invention can also be used with inverse doping, instead of the layer sequence pn$^-$n$^+$p$^+$ from cathode side to anode side that is described above.

According to an alternative version of the invention, the semiconductor body is again covered with a masking layer 5 on the anode side, in which an opening 6 is etched. Then a strongly n-doped zone 11 is generated through the opening 6 in the surface of the stop layer 3, and the masking layer 5 is again removed (FIG. 7). In the next process step (FIG. 8), a p-doped zone 12 is generated on the anode side of the surface of the stop layer 3. The zone 12 has a net doping that is smaller than that of zone 11, but higher than that of zone 3. Next the zones 11 and 12 can be impressed into the semiconductor body (FIG. 9). The anode side of the semiconductor body will then be provided with a contact layer 14, which forms the anode contact. It also forms the short circuit between zone 12, which acts as the anode emitter, and the stop layer 3 belonging to the anode base zone 1.

Here, too, as an alternative, and again if zone 11 has been sufficiently doped, an alloy (for example, Al-Si) can be applied on the anode side after the zone 11 has been generated, for contacting and to connect the thyristor to a carrier board. Yet another available alternative is to dispense with the step in which zone 12 is produced when an Al-Si alloy is applied, since alloying with Al itself generates a p-doped layer.

In these embodiments, too, it is possible to dispense with the stop layer and to use a layer sequence with inverse doping.

We claim:

1. Process for the manufacture of short circuits on the anode side of thyristors, which have an anode base zone of the first conducting type and an emitter zone on the anode side of the second conducting type, characterized by the following steps:
    a) over the entire surface of the anode side of the semiconductor body, there is generated a zone of the second conducting type,
    b) this zone is covered over its entire surface with a masking layer,
    c) the masking layer is structured by photolithography,
    d) grooves are etched in the semiconductor body according to the structure, which extend through the zone of the second conducting type as far as the base zone on the anode side,
    e) in the grooves, zones of the first conducting type are generated, which have a higher doping concentration than the anode base zone,
    f) the masking layer is removed,
    g) the surface of the anode side of the semiconductor body is covered with a contact layer.

2. Process according to claim 1, characterized by the fact that the layer of the second conducting type is impressed in the semiconductor body prior to the generation of the zones of the first conducting type.

3. Process according to claim 1 for the manufacture of short circuits on the anode side of thyristors which have a base zone on the anode side of the first conducting type and an emitter zone on the anode side of the second conducting type, and in which the anode base zone consists of a first, lightly doped zone and a second more highly doped zone of the same conducting type, which lies between the more lightly doped zone and the emitter zone on the anode side,
    characterized by the fact that the grooves are etched in such a manner that they extend into the more highly doped zone of the anode base zone and that in the grooves, zones of the first conducting type are generated, which have a higher doping than the more highly doped zone.

4. Process for the manufacture of short circuits on the anode side of thyristors that have an anode base zone of the first conducting type and an emitter zone on the anode side of the second conducting type, characterized by the following steps:
    a) the entire surface of the anode side of the semiconductor body of the first conducting type is covered with a masking layer.
    b) the masking layer is structured by photolithography,
    c) in the semiconductor body, there are generated, according to the structure zones of the first conducting type, with higher doping than the anode base zone,
    d) the structured masking layer is removed,
    e) over the entire surface of the anode side of the semiconductor body, there is generated a doped zone of the second conducting type, whose doping is smaller than that of the zones of the first conducting type,
    f) the surface of the anode side of the semiconductor body, is covered with a contact layer.

5. Process according to claim 4, characterized by the fact that the doped zone of the second conducting type and the zones of the first conducting type are impressed into the semiconductor body prior to the application of the contact layer.

6. Process according to claim 1, characterized by the fact that the contact layer is generated by alloying.

7. Process according to claim 4, characterized by the fact that the doped zone is generated by the application of a contact layer containing doping material.

8. Process according to claim 4, in which a stop layer is applied to the anode base zone on the anode side, characterized by the fact that the doped zone is applied to the stop layer.

9. Process according to claim 2 for the manufacture of short circuits on the anode side of thyristors which have a base zone on the anode side of the first conducting type and an emitter zone on the anode side of the second conducting type, and in which the anode base zone consists of a first, lightly doped zone and a second more highly doped zone of the same conducting type, which lies between the more lightly doped zone and the emitter zone on the anode side,
    characterized by the fact that the grooves are etched in such a manner that they extend into the more highly doped zone of the anode base zone and that in the grooves, zones of the first conducting type are generated, which have a higher doping than the more highly doped zone.

10. Process according to claim 4, characterized by the fact that the contact layer is generated by alloying.

* * * * *